(12) United States Patent
Wang

(10) Patent No.: US 10,314,180 B2
(45) Date of Patent: Jun. 4, 2019

(54) DISPLAY DEVICE

(71) Applicant: AU Optronics Corporation, Hsin-Chu (TW)

(72) Inventor: Chih-Chung Wang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/817,393

(22) Filed: Nov. 20, 2017

(65) Prior Publication Data

US 2018/0184530 A1 Jun. 28, 2018

(30) Foreign Application Priority Data

Dec. 23, 2016 (TW) .............................. 105143048 A

(51) Int. Cl.
*H05K 5/00* (2006.01)
*G02F 1/13* (2006.01)
*H05K 1/14* (2006.01)

(52) U.S. Cl.
CPC ............. *H05K 5/0017* (2013.01); *G02F 1/13* (2013.01); *H05K 1/147* (2013.01); *H05K 2201/10128* (2013.01)

(58) Field of Classification Search
CPC .... G02F 1/33; G02F 1/33308; G02F 1/33615; G02F 1/34; G02F 1/3452
(Continued)

(56) References Cited

U.S. PATENT DOCUMENTS 7,234,965 B2 6/2007 Hidaka
7,432,998 B2 * 10/2008 Nishio ................ G02F 1/13452
349/150
(Continued)

FOREIGN PATENT DOCUMENTS

CN 101876759 A 11/2010
CN 103091876 A 5/2013
(Continued)

OTHER PUBLICATIONS

National Intellectual Property Administration, "Office action", dated Sep. 29, 2018.

*Primary Examiner* — Tuan T Dinh
(74) *Attorney, Agent, or Firm* — WPAT, PC

(57) ABSTRACT

A display device includes a display panel, a bezel, at least one flexible circuit board, and a rigid circuit board. The display panel includes a display surface. The bezel includes a top wall, a bottom wall, and a side wall between the top wall and the bottom wall. The top wall is configured to support the display panel. The flexible circuit board includes a first portion, a second portion, and a connection portion between the first portion and the second portion. The first portion of the flexible circuit board is connected to the display panel. At least part of the rigid circuit board overlaps and faces the bottom wall of the bezel. The rigid circuit board includes an edge extending outwardly and beyond the side wall. The edge of the rigid circuit board includes at least one recess. The second portion of the flexible circuit board is connected to the rigid circuit board. At least part of the connection portion of the flexible circuit board is accommodated in the recess. On a projection plane parallel to the display surface, the flexible circuit board includes a margin which is closest part of the flexible circuit board to the edge of the rigid circuit board, and the margin of the flexible circuit board is between the side wall of the bezel and the edge of the rigid circuit board.

18 Claims, 18 Drawing Sheets

(58) Field of Classification Search
USPC .................. 361/749–750, 775–778, 803; 174/250–260; 349/149–153
See application file for complete search history.

(56) References Cited

U.S. PATENT DOCUMENTS

| | | | | |
|---|---|---|---|---|
| 8,373,835 | B2* | 2/2013 | Nobeoka | G02F 1/133308 |
| | | | | 349/150 |
| 8,382,361 | B2* | 2/2013 | Park | G02B 6/009 |
| | | | | 174/254 |
| 8,885,350 | B2* | 11/2014 | Liu | G02F 1/133308 |
| | | | | 174/252 |
| 2003/0203515 | A1* | 10/2003 | Lin | H01L 21/31053 |
| | | | | 438/8 |
| 2005/0179850 | A1* | 8/2005 | Du | G02F 1/133615 |
| | | | | 349/150 |
| 2006/0114694 | A1* | 6/2006 | Cho | G02B 6/0083 |
| | | | | 362/631 |
| 2010/0128194 | A1 | 5/2010 | Cho et al. | |
| 2011/0038128 | A1* | 2/2011 | Kitagawa | G02F 1/133308 |
| | | | | 361/749 |
| 2015/0277179 | A1* | 10/2015 | Nishi | G02B 6/0088 |
| | | | | 349/58 |
| 2018/0173041 | A1 | 6/2018 | Zhan et al. | |

FOREIGN PATENT DOCUMENTS

| | | |
|---|---|---|
| CN | 104991369 A | 10/2015 |
| CN | 204759274 U | 11/2015 |
| TW | 201326965 A | 7/2013 |
| TW | 201432510 A | 8/2014 |

\* cited by examiner

DISPLAY DEVICE

BACKGROUND

Technical Field

The present invention relates to a display device, and in particular, to a display device in which a rigid circuit board overlaps at a bottom of a bezel.

Related Art

Generally, a display panel of a display device is connected to a rigid circuit board through a flexible circuit board. The rigid circuit board may overlap at a bottom of a bezel by using a bent flexible circuit board.

However, due to limitation of space configuration of the bezel, the bezel cannot extend beyond an outer edge of a bent part of the flexible circuit board. That is, the flexible circuit board is configured outside of the display device and is not protected by the bezel. When the display device is wrapped by a tape, the flexible circuit board is pressed by the tape, easily damaging a circuit of the flexible circuit board, and resulting in a display problem.

SUMMARY

An objective of an embodiment of the present invention is to provide a display device, so as to reduce a rate of circuit damage of a flexible circuit board, and further, to decrease a display problem of the display device.

In an embodiment, a display device is provided, including: a display panel, a bezel, at least one flexible circuit board, and a rigid circuit board. The display panel includes a display surface. The bezel includes a top wall, a bottom wall, and a side wall between the top wall and the bottom wall. The top wall is configured to support the display panel. The flexible circuit board includes a first portion, a second portion, and a connection portion between the first portion and the second portion. The first portion of the flexible circuit board is connected to the display panel. At least part of the rigid circuit board overlaps and faces the bottom wall of the bezel. The rigid circuit board includes an edge extending outwardly and beyond the side wall. The edge of the rigid circuit board includes at least one recess. The second portion of the flexible circuit board is connected to the rigid circuit board, and at least part of the connection portion of the flexible circuit board is accommodated in the recess. On a projection plane parallel to the display surface, the flexible circuit board includes a margin which is closest part of the flexible circuit board to the edge of the rigid circuit board, and the margin of the flexible circuit board is between the side wall of the bezel and the edge of the rigid circuit board.

Because the rigid circuit board includes the edge extending outwardly and beyond the side wall of the bezel, and includes the recess configured to accommodate at least part of the connection portion of the flexible circuit board, on the projection plane parallel to the display surface, the margin of the flexible circuit board is between the side wall of the bezel and the edge of the rigid circuit board, and the flexible circuit board is protected by the edge of the rigid circuit board, thereby reducing a rate that the flexible circuit board is pressed by the tape and a circuit is damaged.

DETAILED DESCRIPTION

Figure 1:
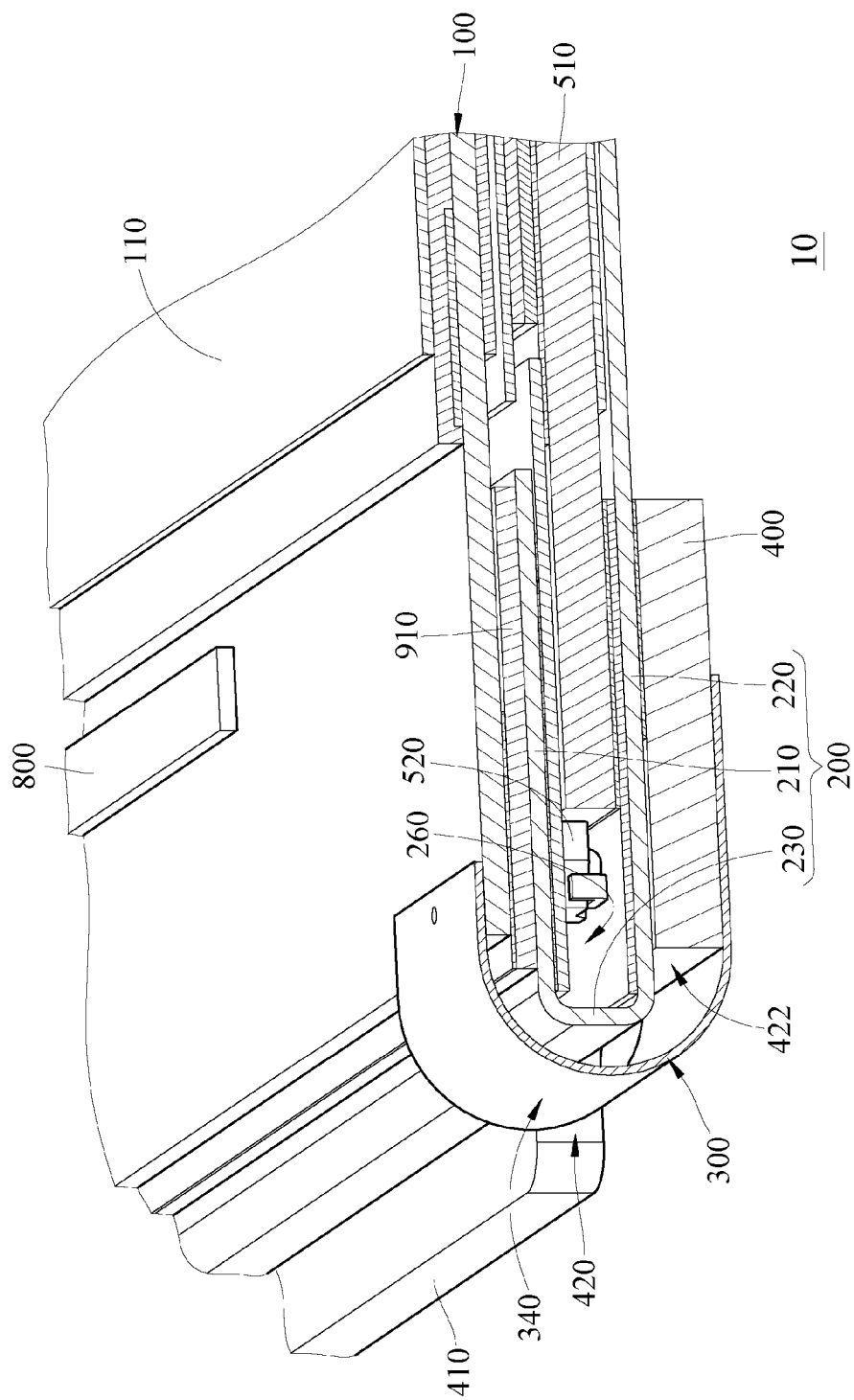
FIG. 1 is a partial oblique view of a display device according to an embodiment of the present invention.
Figure 2:
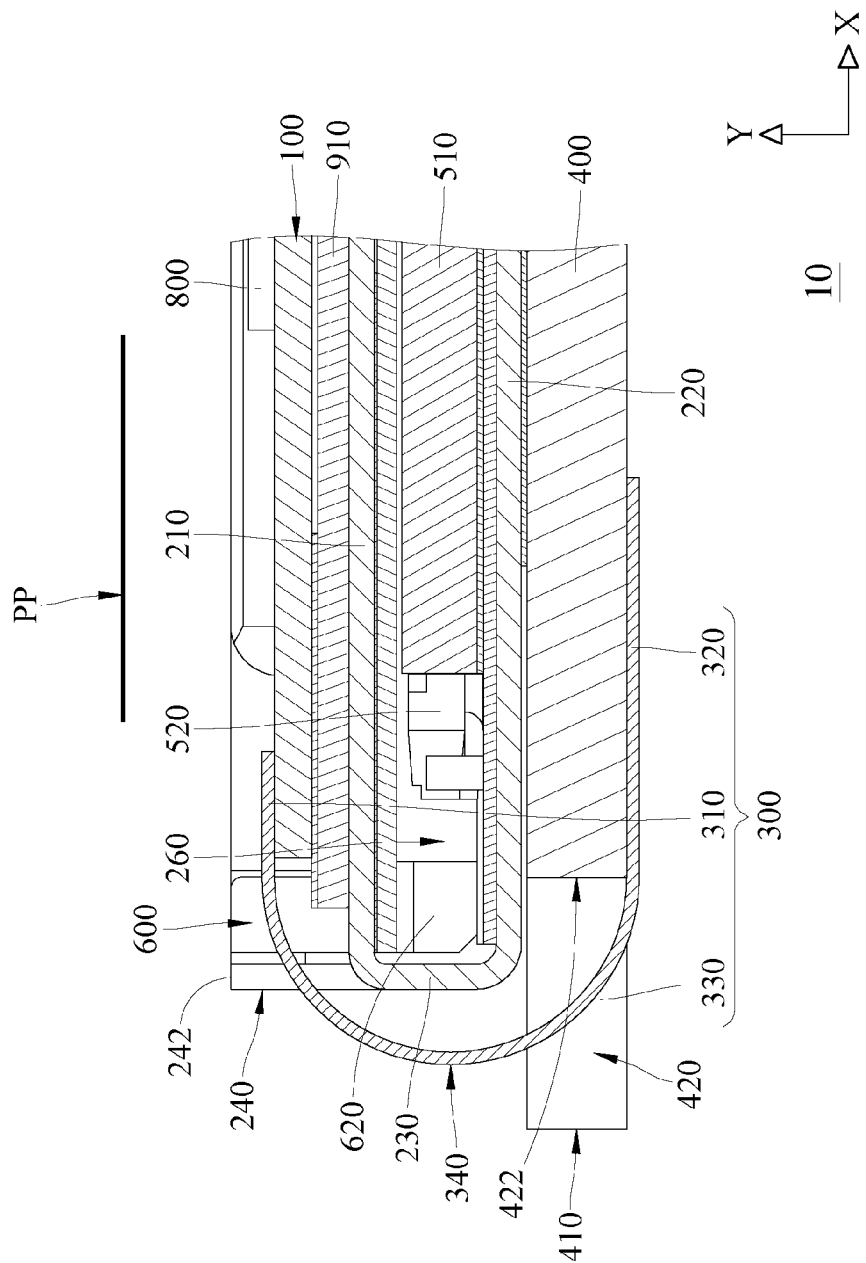
FIG. 2 is a partial side view of the display device in FIG. 1.

Referring to FIG. 1 and FIG. 2, FIG. 1 is a partial oblique view of a display device according to an embodiment of the present invention, and FIG. 2 is a partial side view of the display device in FIG. 1. In this embodiment, the display device 10 includes a display panel 100, a bezel 200, at least one flexible circuit board 300, and a rigid circuit board 400. The display panel 100 includes a display surface 110. The bezel 200 includes a top wall 210, a bottom wall 220, and a side wall 230 between the top wall 210 and the bottom wall 220. The top wall 210 is configured to support the display panel 100. In an embodiment, the top wall 210 of the bezel 200, for example, support the display panel 100 by using a cushion 910. Glue may be dispensed on the entire or part of the cushion 910, and may be adjusted according to a requirement.

The flexible circuit board 300 includes a first portion 310, a second portion 320, and a connection portion 330 between the first portion 310 and the second portion 320. The first portion 310 of the flexible circuit board 300 is connected to the display panel 100, and the second portion 320 of the flexible circuit board 300 is connected to the rigid circuit board 400. At least part of the rigid circuit board 400 overlaps and faces the bottom wall 220 of the bezel 200. The rigid circuit board 400 includes an edge 410 extending outwardly and beyond the side wall 230. The edge 410 of the rigid circuit board 400 includes at least one recess 420. The recess 420, for example, is recessed from the edge 410 towards inside of the rigid circuit board 400. At least part of the connection portion 330 of the flexible circuit board 300 is accommodated in the recess 420. The flexible circuit board 300 includes a margin 340. The margin 340 of the flexible circuit board 300 is closest part of the flexible circuit board 300 to the edge 410 of the rigid circuit board 400 on a projection plane PP (that is, an XZ plane) parallel to the display surface 110. In another word, the margin 340 may be an outermost part of the flexible circuit board 300. On the projection plane PP (that is, the XZ plane) parallel to the display surface 110, the margin 340 of the flexible circuit board 300 is between the side wall 230 of the bezel 200 and the edge 410 of the rigid circuit board 400.

Because the rigid circuit board 400 includes the edge 410 extending outwardly and beyond the side wall 230 of the bezel 200, and the rigid circuit board 400 includes the recess 420 configured to accommodate at least part of the connection portion 330 of the flexible circuit board 300, on the projection plane PP parallel to the display surface 110, the margin 340 of the flexible circuit board 300 is between the side wall 230 of the bezel 200 and the edge 410 of the rigid circuit board 400, and the flexible circuit board 300 is protected by the edge 410 of the rigid circuit board 400, thereby reducing a rate that the flexible circuit board 300 is pressed by a tape and a circuit is damaged.

In addition, in an embodiment, the recess 420, for example, includes an inner side 422 substantially parallel to the edge 410 of the rigid circuit board 400. On the projection plane PP parallel to the display surface 110, the side wall 230 of the bezel 200 may be between the edge 410 of the rigid circuit board 400 and the inner side 422 of the recess 420 of the rigid circuit board 400. It should be noted that the rigid circuit board 400 includes the edge 410 extending outwardly and beyond the side wall 230 of the bezel 200 for protecting the flexible circuit board 300, and the inner side 422 of the recess 420 of the rigid circuit board 400, for example, extends inward for avoiding overlapping with the side wall 230 of the bezel 200, a lower edge of the connection portion 330 of the flexible circuit board 300 (that is, a part, adjacent to the second portion 320, of the connection portion 330) is not vulnerable to be pressed by the inner side 422 of the rigid circuit board 400.

Figure 3:
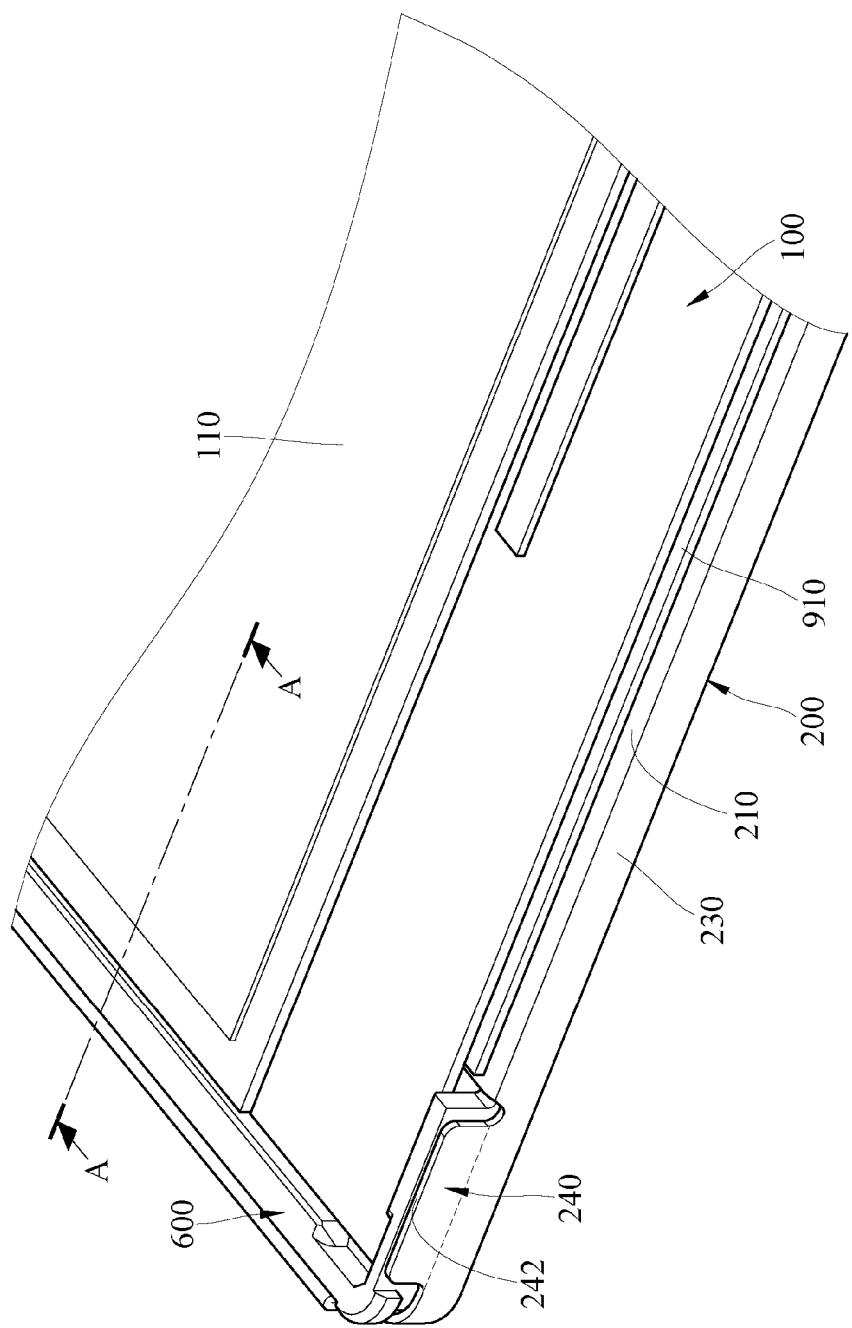
FIG. 3 is a partial oblique view from another observation angle of the display device in FIG. 1.
Figure 4:
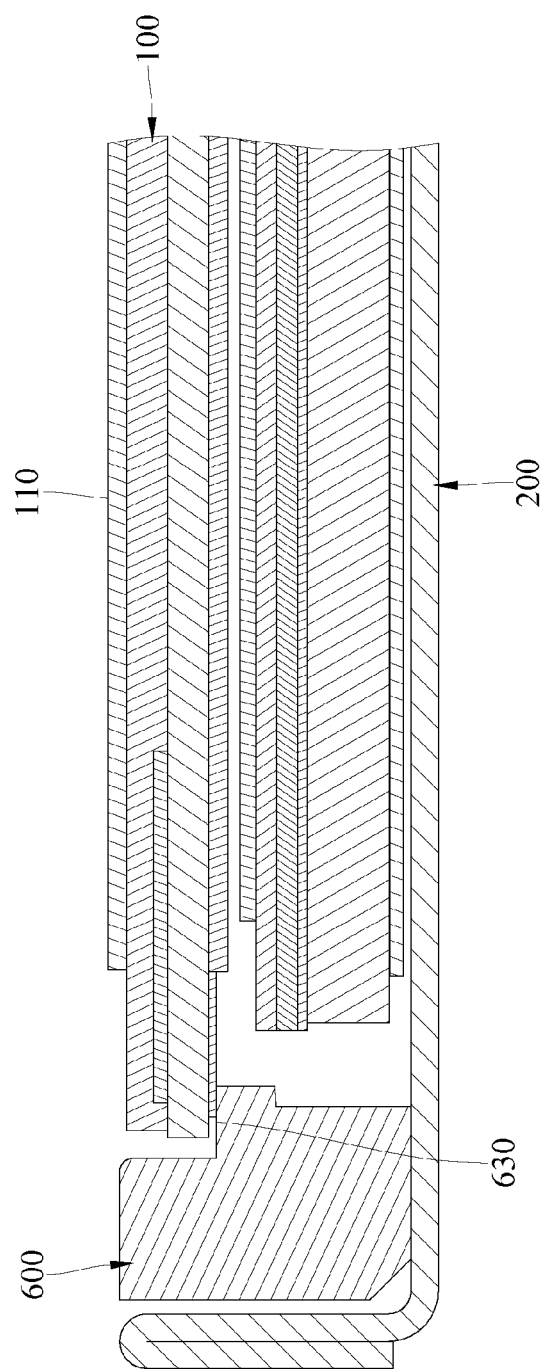
FIG. 4 is a cross-sectional view of the display device in FIG. 3 along a section line A-A.

Referring to FIG. 1, FIG. 2, FIG. 3, and FIG. 4, FIG. 3 is a partial oblique view from another observation angle of the display device in FIG. 1, and FIG. 4 is a cross-sectional view of the display device in FIG. 3 along a section line A-A. In addition, for ease of description, the flexible circuit board and the rigid circuit board are not shown in FIG. 3. In an embodiment, the display device 10 may include a frame body 600. At least part of the frame body 600 surrounds the display panel 100. The frame body 600 may be configured to support the display panel 100. The frame body 600, for example, includes a support surface 630 configured to support the display panel 100. The support surface 630 may, for example, be configured thereon with an adhesion piece for fixing the display panel 100. It should be noted that in an embodiment, the display panel 100 may be jointly supported by the top wall 210 of the bezel 200 and the support surface 630 of the frame body 600. Referring to FIG. 1, FIG. 2, FIG. 3, and FIG. 5, FIG. 5 is an exploded view of the display device in FIG. 1 in which the frame body has not been assembled with the bezel. In an embodiment, the frame body 600 may include an engagement portion 620. The engagement portion 620 of the frame body 600 may extend into accommodation space 260 surrounded by the top wall 210, the bottom wall 220, and the side wall 230 of the bezel 200. In another word, the frame body 600 and the bezel 200 may be easily combined by using the engagement portion 620 of the frame body 600, and be easily disassembled even if when reworking is required. The frame body 600 and the bezel 200 can jointly support the display panel 100 after being combined. In addition, the accommodation space 260 surrounded by the top wall 210, the bottom wall 220, and the side wall 230 of the bezel 200 may accommodate configuration of components such as a light source 520, a light guide plate 510, and a reflection sheet. The configuration of the components in the accommodation space may be adjusted according to a requirement, and is not specially limited herein.

Figure 5:
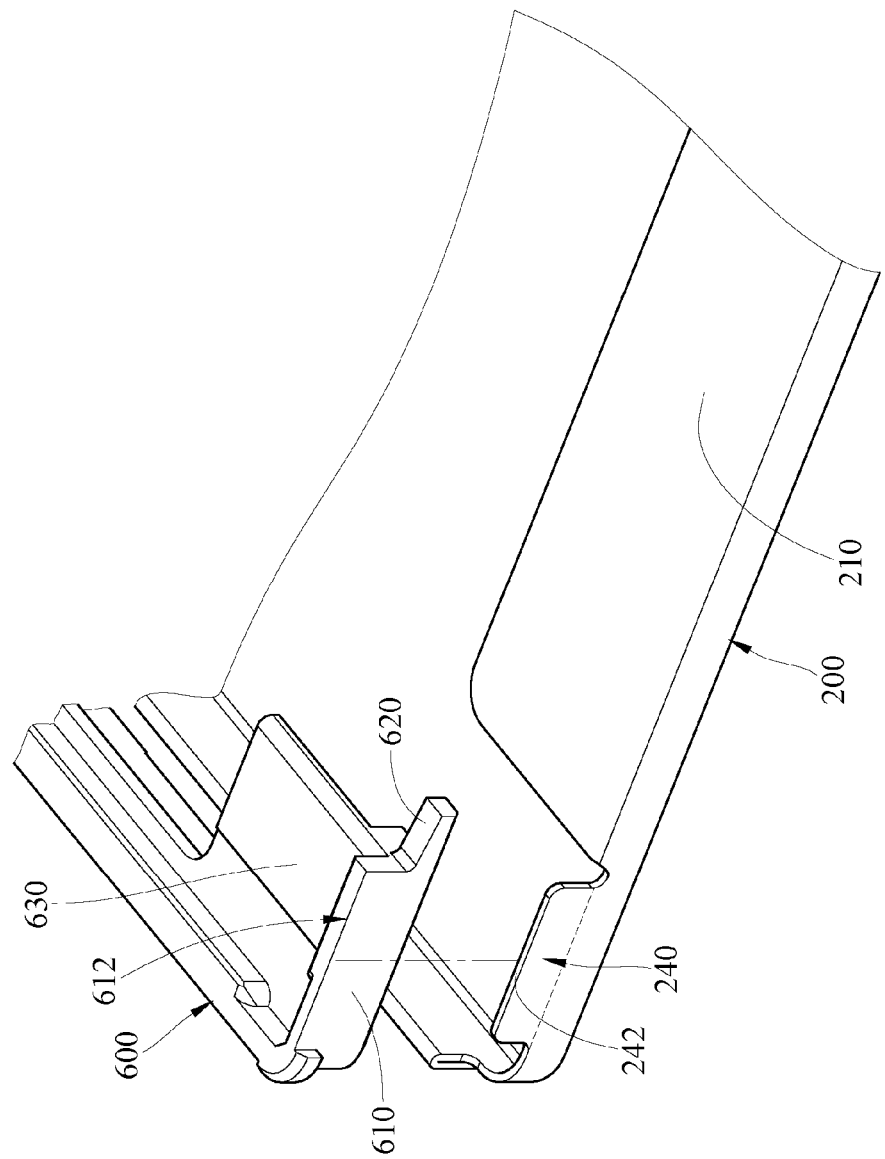
FIG. 5 is an exploded view of the display device in FIG. 1 in which a frame body has not been assembled with a bezel.
Figure 6:
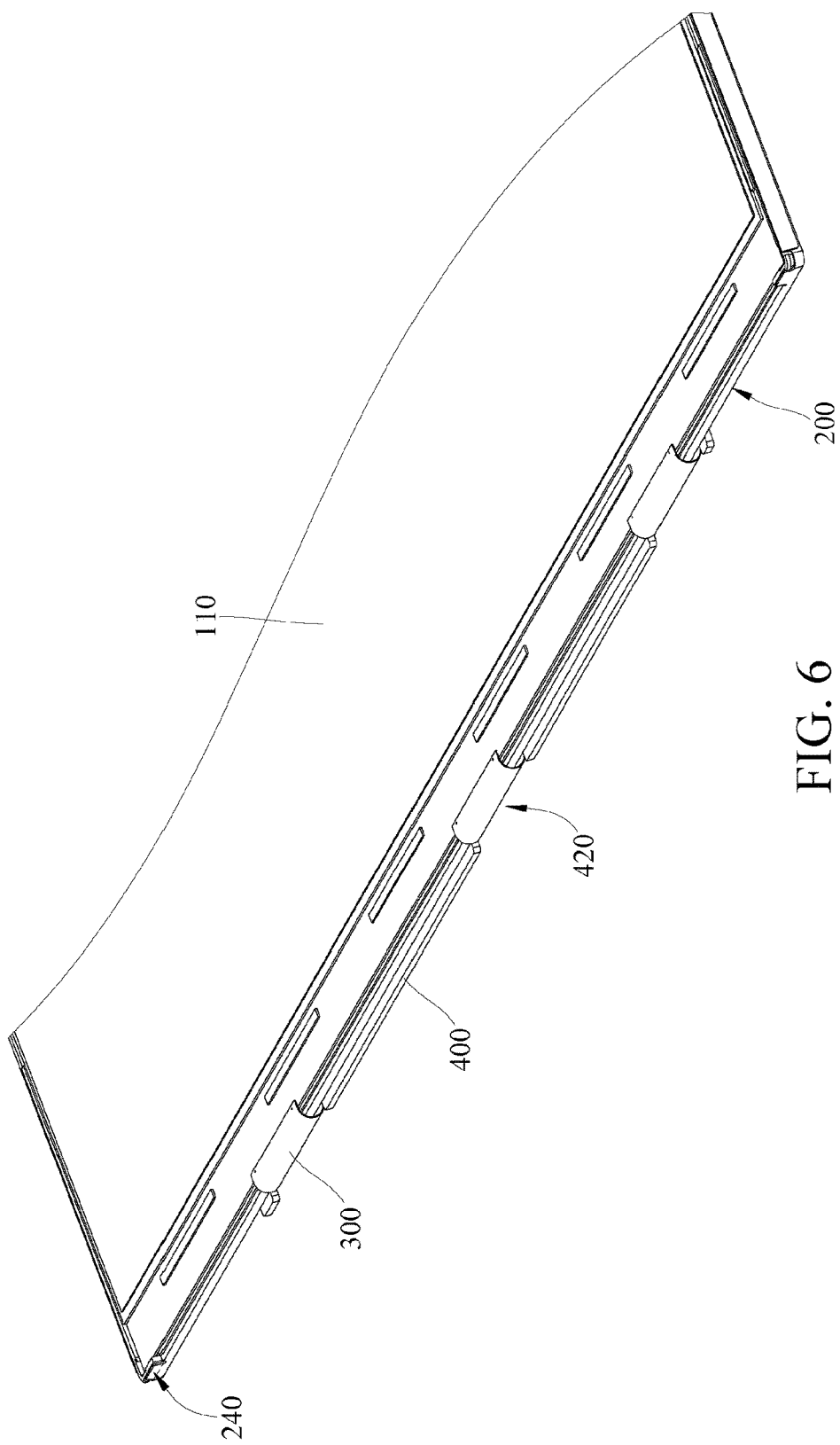
FIG. 6 is a partial oblique view from another observation angle of the display device in FIG. 1.

Referring to FIG. 2, FIG. 3, and FIG. 5, in an embodiment, the bezel 200 may include at least one baffle wall 240. The baffle wall 240, for example, extends out from the side wall 230 toward a direction away from the rigid circuit board 400. An end part 242 of the baffle wall 240 is higher than the first portion 310 of the flexible circuit board 300. It should be noted that because the end part 242 of the baffle wall 240 is higher than the first portion 310 of the flexible circuit board 300, a rate that the first portion 310 of the flexible circuit board 300 is pressed by a tape and a circuit is damaged is reduced. Referring to FIG. 2, FIG. 3, FIG. 5, and FIG. 6, FIG. 6 is a partial oblique view from another observation angle of the display device in FIG. 1. In an embodiment, on the projection plane PP parallel to the display surface 110, the baffle wall 240 does not overlap with the rigid circuit board 400. Specifically, on the projection plane PP parallel to the display surface 110, the baffle wall 240 of the bezel 200 does not overlap with the top wall 210 of the bezel 200. That is, the baffle wall 240 and the top wall 210 of the bezel 200 are staggeredly disposed. Therefore, the baffle wall 240 of the bezel 200 does not flip over from the top wall 210 of the bezel 200, and structural strength of the bezel 200 is maintained. In addition, in an embodiment, a length of the top wall 210 is, for example, is greater than that of the baffle wall 240, so that the top wall 210 can provide a sufficient support area to support the display panel 100, and provide sufficient accommodation space 260 to accommodate components such as the light source 520 and the light guide plate 510. Further, the baffle wall 240 is not excessively long, so that the edge of the display device 10 does not apparently protrude.

Referring to FIG. 2, FIG. 3, FIG. 5, and FIG. 6, in an embodiment, the frame body 600 includes a side surface 610 where the frame body is adjacent to the edge 410 of the rigid circuit board 400. The side surface 610 of the frame body 600, for example, does not extend beyond the side wall 230 or the baffle wall 240 of the bezel 200. The baffle wall 240 may wrap at least part of the side surface 610 of the frame body 600 for protecting the frame body 600 and increasing bearing strength of the frame body 600.

Figure 7:
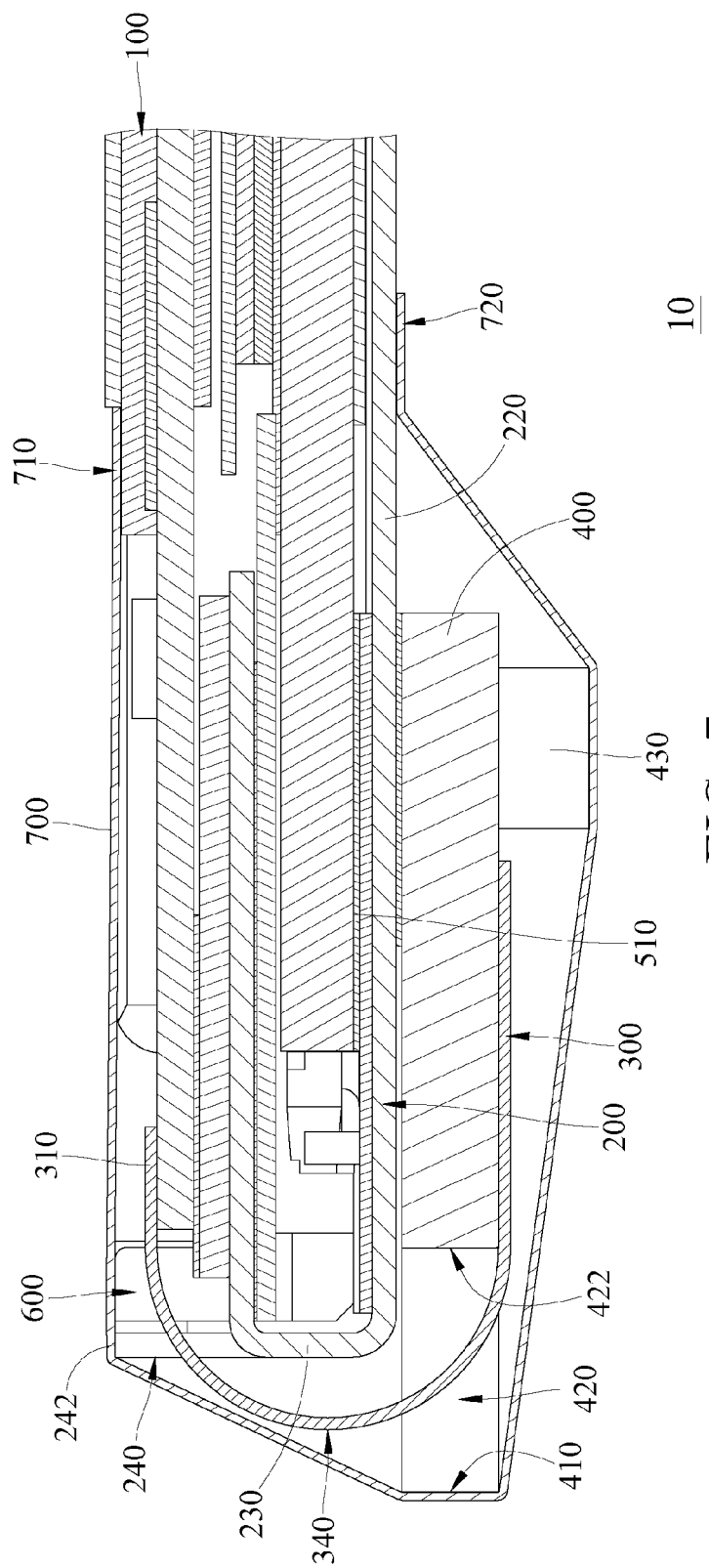
FIG. 7 is a partial side view of the display device in FIG. 1 in which a tape is configured.

Referring to FIG. 7, FIG. 7 is a partial side view of the display device in FIG. 1 in which a tape is configured. The display device 10 may include a tape 700. One end 710 of the tape 700 is stuck on the display panel 100, and the other end 720 of the tape 700 is stuck on a surface, which faces the rigid circuit board 400, of the bottom wall 220 of the bezel 200. The tape 700 surrounds the flexible circuit board 300 and the rigid circuit board 400, and the tape 700 is in contact with the end part 242 of the baffle wall 240 of the bezel 200 and the edge 410 of the rigid circuit board 400. Because the edge 410 of the rigid circuit board 400 extends outwardly and beyond the side wall 230 of the bezel 200, and the end part 242 of the baffle wall 240 of the bezel 200 is higher than the first portion 310 of the flexible circuit board 300, a situation in which the flexible circuit board 300 is pressed by the tape 700 and a circuit is damaged can be effectively reduced. In an embodiment, only the two ends of the tape 700 are sticky. For example, the end 710, stuck on the display panel 100, of the tape 700 and the other end 720, stuck on the bottom wall 220 of the bezel 200, of the tape 700 are configured with adhesion layers, and a remaining part is not configured with an adhesion layer, to prevent a circuit area of the rigid circuit board 400 or the flexible circuit board 300 from being stuck during assembly, thereby preventing position deviation and circuit damages. Further, as shown in FIG. 7, the tape 700 is not in contact with the flexible circuit board 300, but the present invention is not limited thereto. The part, which is not configured with an adhesion layer, of the tape 700 may be partially and slightly in contact with the flexible circuit board 300 (for example, only partially tangent to the flexible circuit board 300), but the circuit is not damaged because the flexible circuit board 300 is not strongly pressed. In addition, an electronic component 430 such as a connector may be disposed on the rigid circuit board 400. The tape 700 surrounds the rigid circuit board 400 and wraps the electronic component 430 at the same time. It should be noted that the tape 700 may, for example, further include a conductive layer, to achieve the effect of preventing electromagnetic interference (EMI) and electrostatic discharge (ESD).

Figure 8:
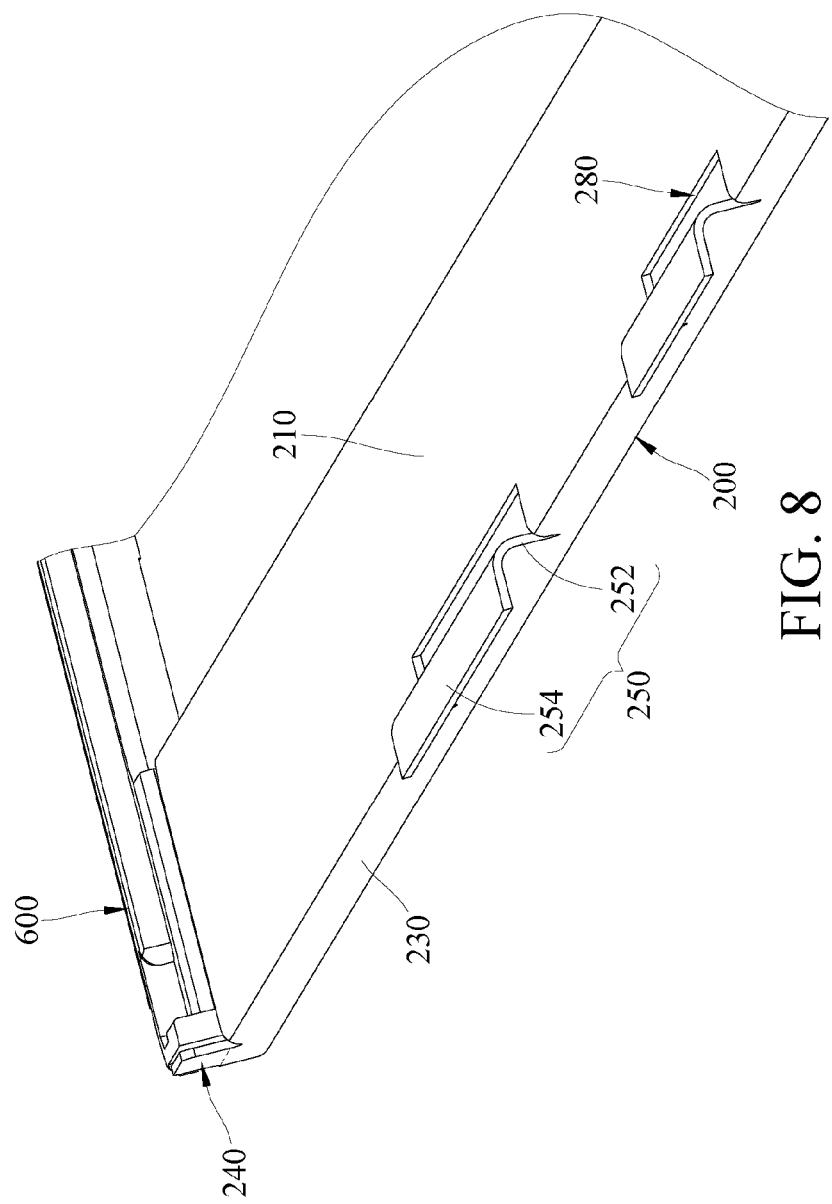
FIG. 8 is a partial oblique view in which a frame body has been assembled with a bezel according to another embodiment of the present invention.
Figure 9:
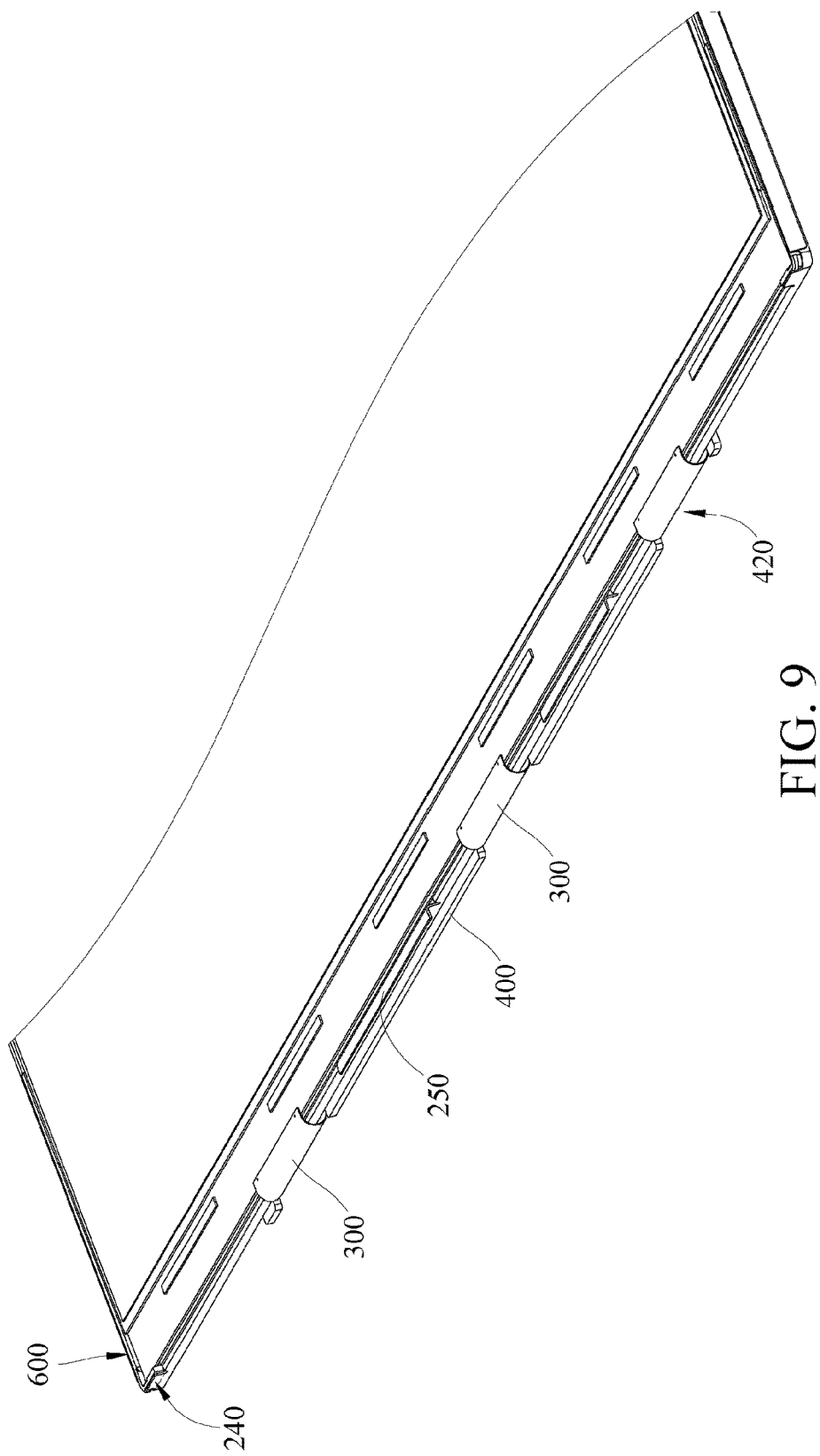
FIG. 9 is a partial oblique view of the display device according to another embodiment of the present invention.
Figure 10:
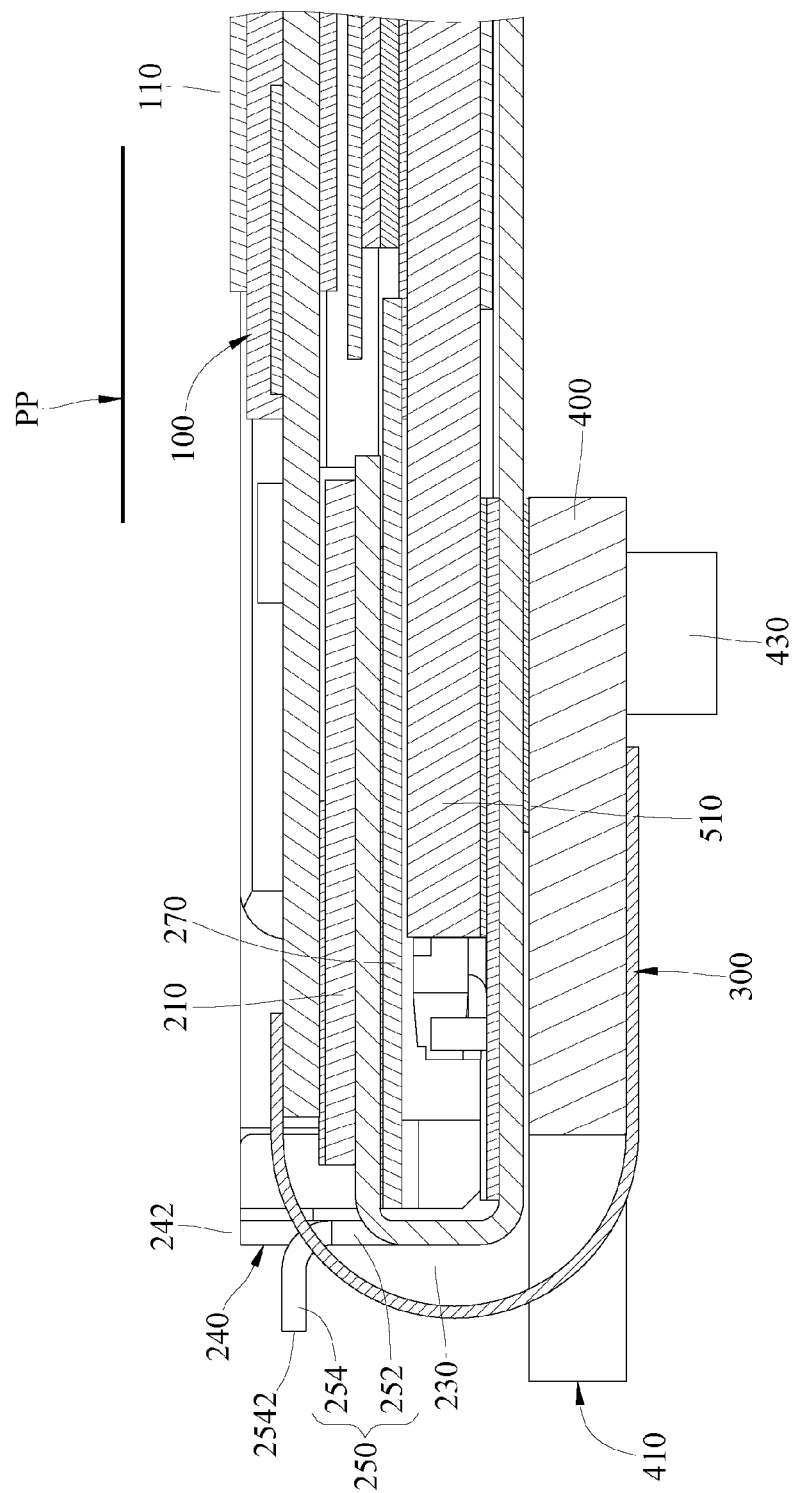
FIG. 10 is a partial side view of the display device in FIG. 9.

Referring to FIG. 8, FIG. 9, and FIG. 10, FIG. 8 is a partial oblique view in which a frame body has been assembled with a bezel according to another embodiment of the present invention, FIG. 9 is a partial oblique view of the display device according to another embodiment of the present invention, and FIG. 10 is a partial side view of the display device in FIG. 9. In an embodiment, a bezel 200 may include an extension wall 250. The extension wall 250 includes, for example, a first segment 252 and a second segment 254 that are connected. The first segment 252 of the extension wall 250 extends out from a side wall 230 toward a direction away from a rigid circuit board 400. The second segment 254 of the extension wall 250 is connected to the first segment 252, and bends toward a direction of an edge 410 of the rigid circuit board 400. That is, a flexible circuit board 300 may be protected by the edge 410 of the rigid circuit board 400 and an end part 242 of a baffle wall 240 of the bezel 200. In addition, that the extension wall 250 bends toward the direction of the edge 410 of the rigid circuit board 400 can also provide similar protection. When a tape surrounds the flexible circuit board 300, the extension wall 250 makes the tape to be more distant from the flexible circuit board 300, to reduce a rate that the flexible circuit board 300 is pressed by the tape and a circuit is damaged. In addition, in an embodiment, the second segment 254 of the extension wall 250 may include an end part 2542. On a projection plane PP parallel to a display surface 110, the end part 2542 of the second segment 254 of the extension wall 250, for example, does not extend outwardly and beyond the edge 410 of the rigid circuit board 400. Because the extension wall 250 of the bezel 200 does not extend outwardly and beyond the edge 410 of the rigid circuit board 400, the bezel 200 is prevented from occupying excessively much configuration space, thereby pre-reserving space for configuring another object, and conforming to a thinning trend of display devices.

In an embodiment, at least part of the second segment 254 of the extension wall 250 is perpendicular to the first segment 252, but the present invention is not limited thereto. The second segment 254 of the extension wall 250 may also tilt downwardly (shown in FIG. 16 and FIG. 17) or tilt upwardly (not shown), and may be adjusted according to a requirement. When the second segment 254 of the extension wall 250 tilts upwardly (not shown), the end part 2542 of the extension wall 250, for example, does not extend beyond the end part 242 of the baffle wall 240, thereby avoiding causing partial protrusion and unflatness.

Referring to FIG. 8, FIG. 9, and FIG. 10, in an embodiment, at least one flexible circuit board 300 is, for example, two flexible circuit boards 300. The extension wall 250 is located between the two flexible circuit boards 300. Because the extension wall 250 is located between the two adjacent flexible circuit boards 300, the extension wall 250 does not affect a wire outlet position from the flexible circuit board 300 to the rigid circuit board 400, and the extension wall 250 can protect the flexible circuit board 300 more effectively, preventing the flexible circuit board 300 from being pressed by the tape. It should be noted that the quantity and the position of the flexible circuit board 300 are not limited thereto, and a required quantity and position may be adjusted according to a requirement.

In addition, in an embodiment, on the projection plane PP parallel to the display surface 110, the extension wall 250 overlaps with the rigid circuit board 400. It should be noted that the extension wall 250, for example, flips over from a top wall 210 of the bezel 200 with a cutting line, making the extension wall 250 located between the two adjacent flexible circuit boards 300. When the extension wall 250 flips over from the top wall 210 of the bezel 200, a hole 280 is formed in the top wall 210 of the bezel 200. To prevent light leakage caused by the hole 280 of the top wall 210 of the bezel 200, a reflection component 270 configured below the top wall 210 of the bezel 200 may extend to cover the hole 280 and block light. In addition, the reflection component 270, for example, is disposed between the top wall 210 of the bezel 200 and the light guide plate 510, so as to increase utilization of the light source. Further, the extension wall 250 may not flip over from the bezel 200. The extension wall 250 may be a separate component, for example, may be fixed on the bezel 200 by means of welding, pasting, or assembling, and fixing manners are not specially limited herein.

Figure 11:
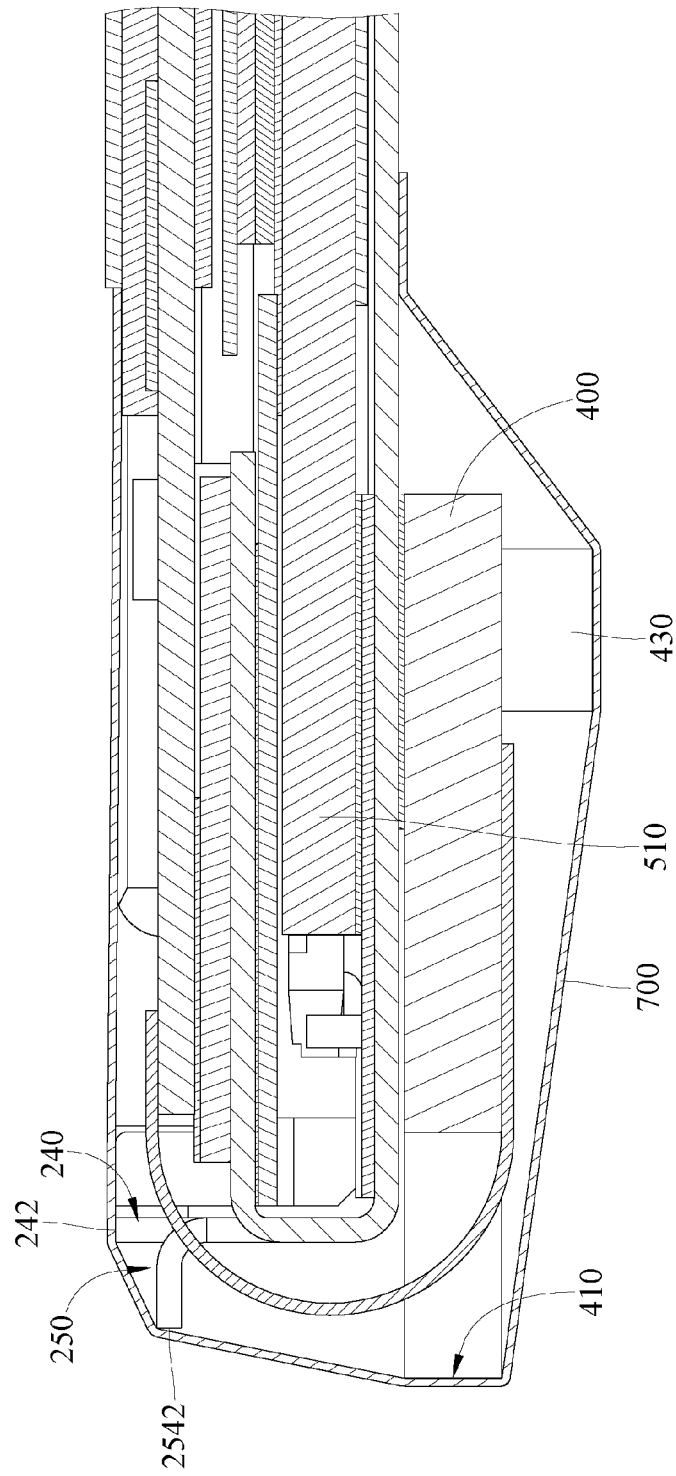
FIG. 11 is a partial side view of the display device in FIG. 10 in which a tape is configured.

Referring to FIG. 8, FIG. 9, FIG. 10, and FIG. 11, FIG. 11 is a partial side view of the display device in FIG. 10 in which a tape is configured. It should be noted that FIG. 11 is similar to FIG. 7, and a main difference is that the bezel 200 in FIG. 11 includes the extension wall 250, so that in addition to being in contact with the end part 242 of the baffle wall 240 of the bezel 200 and the edge 410 of the rigid circuit board 400, the tape 700 is further in contact with the end part 2542 of the second segment 254 of the extension wall 250. Because the extension wall 250 bends toward the direction of the edge 410 of the rigid circuit board 400, when the tape 700 surrounds the flexible circuit board 300, the tape 700 is also more distant from the flexible circuit board 300, reducing a rate that the flexible circuit board 300 is depressed by the tape 700 and the circuit is damaged.

Figure 12:
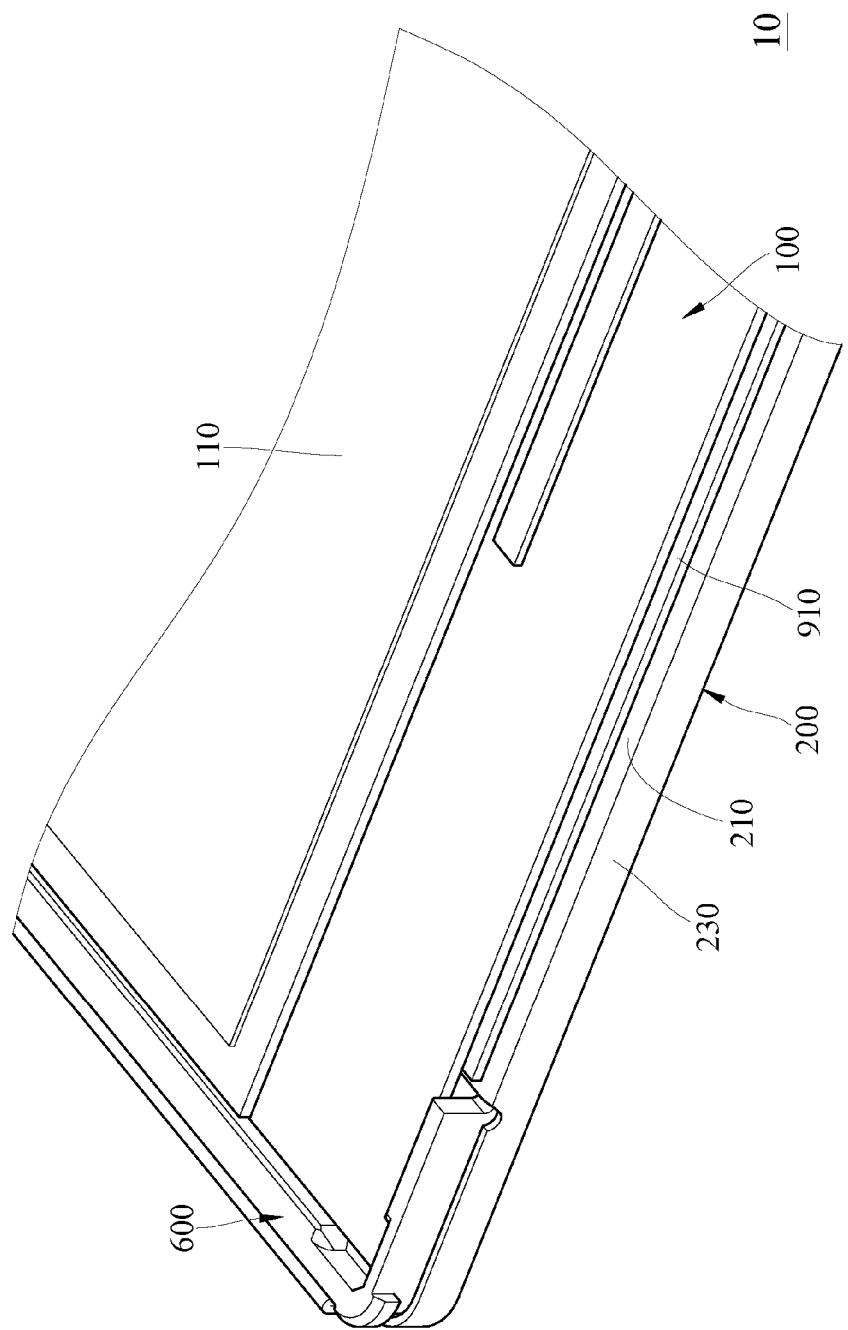
FIG. 12 is a partial oblique view of a display device according to still another embodiment of the present invention.
Figure 13:
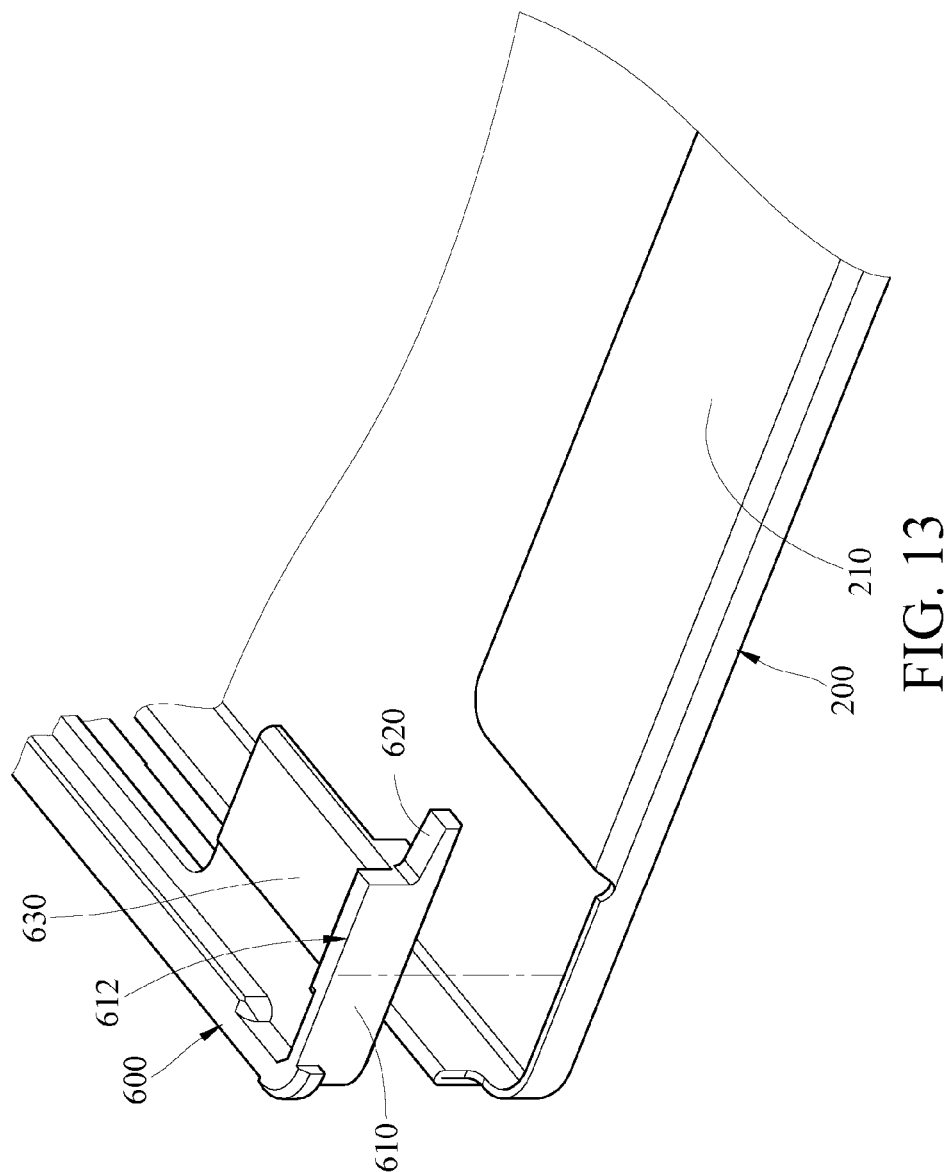
FIG. 13 is an exploded view of the display device in FIG. 12 in which a frame body has not been assembled with a bezel.
Figure 14:
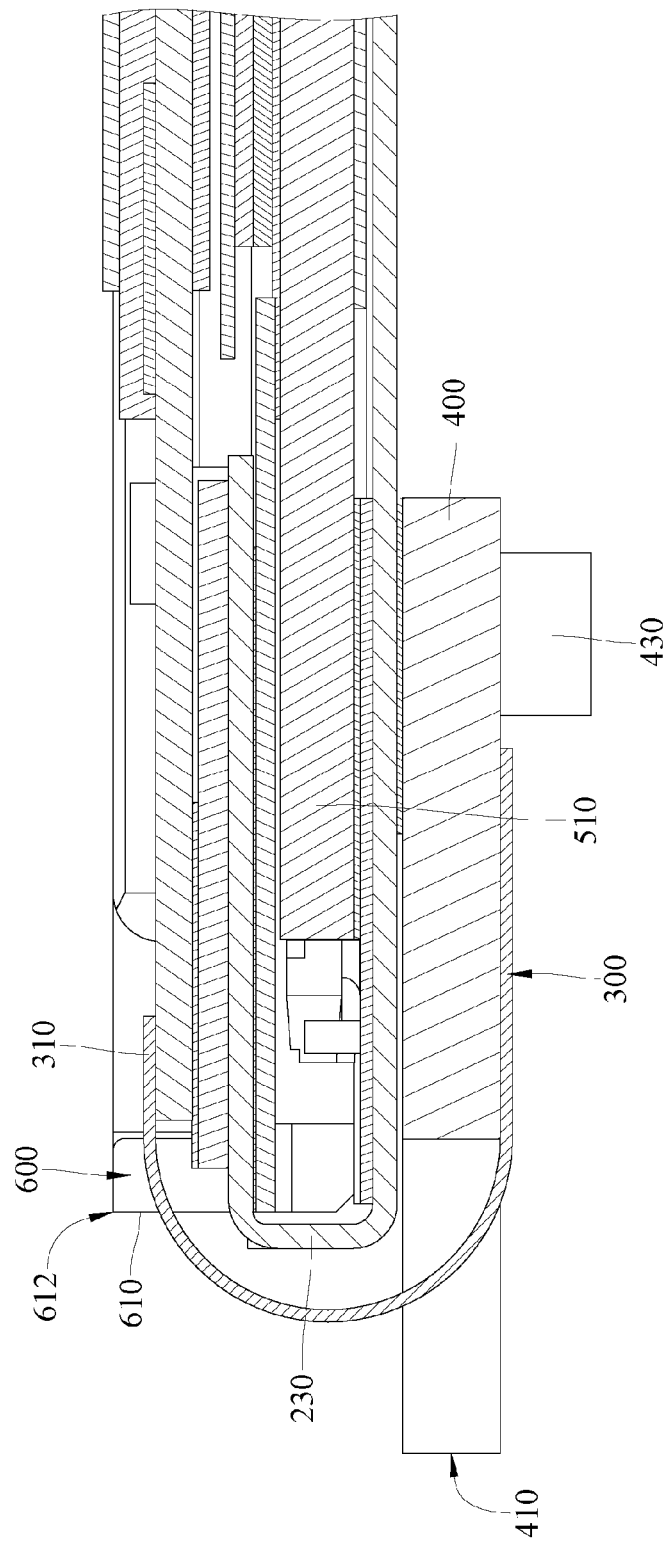
FIG. 14 is a partial side view of the display device in FIG. 12.

Referring to FIG. 12, FIG. 13, and FIG. 14, FIG. 12 is a partial oblique view of a display device according to still another embodiment of the present invention, FIG. 13 is an exploded view of the display device in FIG. 12 in which a frame body has not been assembled with a bezel, and FIG. 14 is a partial side view of the display device in FIG. 12. For ease of description, a flexible circuit board and a rigid circuit board are not shown in FIG. 12. In an embodiment, for an adjustment of space configuration of a display device 10 (for example, a position of a rotation shaft needs to be pre-reserved when the display device is applied to a notebook computer), or a lightening and thinning trend, a baffle wall of a bezel 200 may be omitted, and a side surface 610 of a frame body 600 is partially shown and is not wrapped by the bezel 200. More specifically, the frame body 600 includes, for example, the side surface 610 where the frame body 600 is adjacent to an edge 410 of a rigid circuit board 400. The side surface 610 of the frame body 600 does not extend beyond a side wall 230 of the bezel. The side surface 610 includes an end portion 612 in a direction away from the rigid circuit board 400. The end portion 612 of the frame body 600 is higher than a first portion 310 of a flexible circuit board 300. It should be noted that because the end portion 612 of the frame body 600 is higher than the first portion 310 of the flexible circuit board 300, a rate that the first portion 310 of the flexible circuit board 300 is pressed by a tape and a circuit is damaged is reduced.

Figure 15:
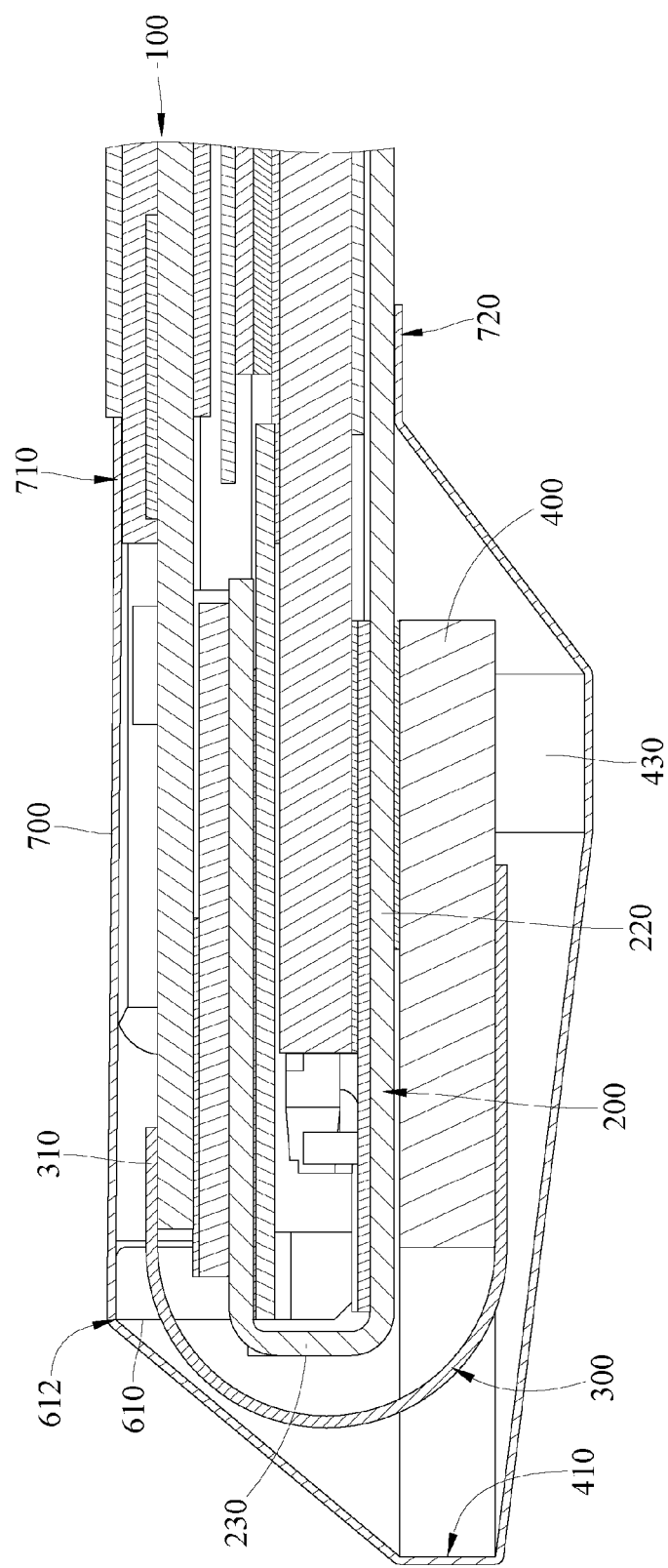
FIG. 15 is a partial side view of the display device in FIG. 14 in which a tape is configured.

Referring to FIG. 14 and FIG. 15, FIG. 15 is a partial side view of the display device in FIG. 14 in which a tape is configured. FIG. 15 is similar to FIG. 7, except that the baffle wall of the bezel 200 is removed, and the side surface 610 of the frame body 600 is partially shown. Specifically, one end 710 of a tape 700 is stuck on a display panel 100, and the other end 720 of the tape 700 is stuck on a surface, which faces the rigid circuit board 400, of a bottom wall 220 of the bezel 200. The tape 700 surrounds the flexible circuit board 300 and the rigid circuit board 400, and the tape 700 is in contact with the end portion 612 of the frame body 600 and the edge 410 of the rigid circuit board 400. Because the edge 410 of the rigid circuit board 400 extends outwardly and beyond the side wall 230 of the bezel 200, and the end portion 612 of the frame body 600 is higher than the first portion 310 of the flexible circuit board 300, a situation in which the flexible circuit board 300 is pressed by the tape 700 and the circuit is damaged is reduced.

Figure 16:
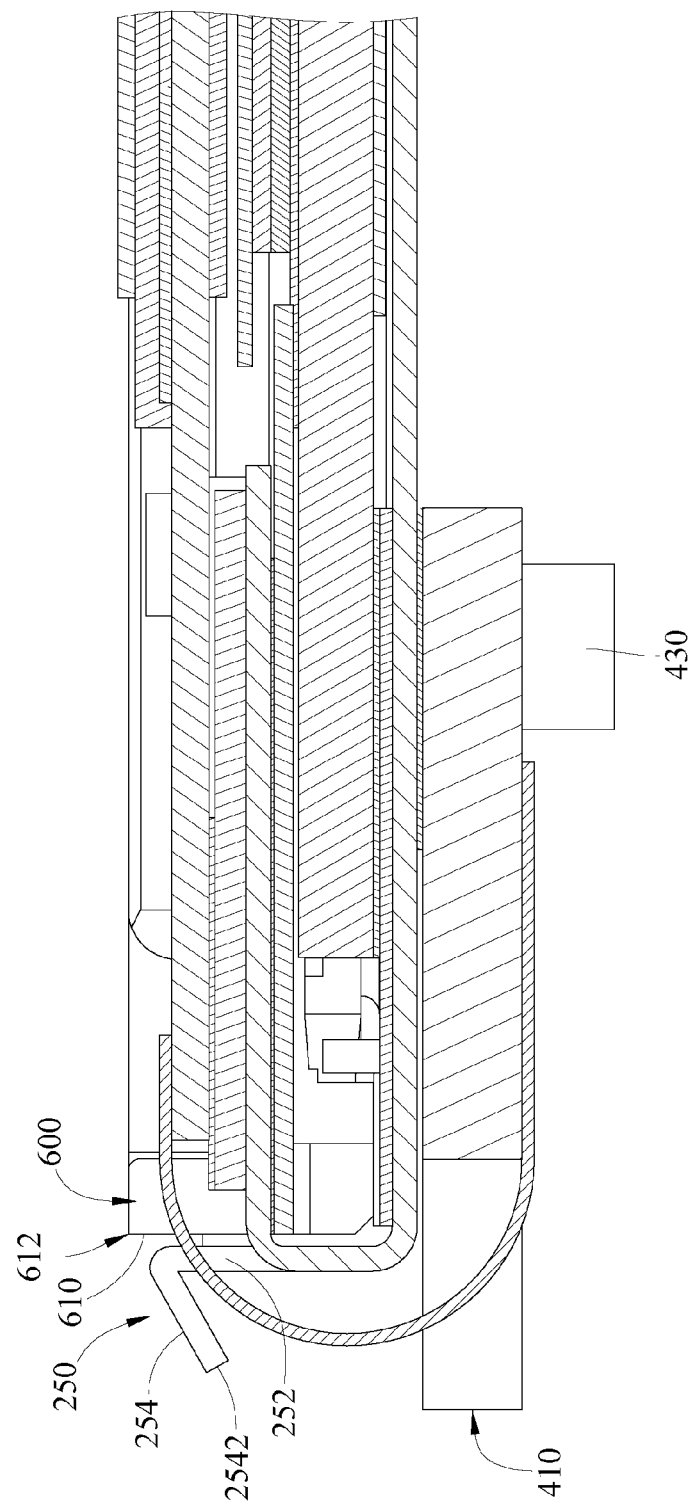
FIG. 16 is a partial side view of a display device according to yet another embodiment of the present invention.
Figure 17:
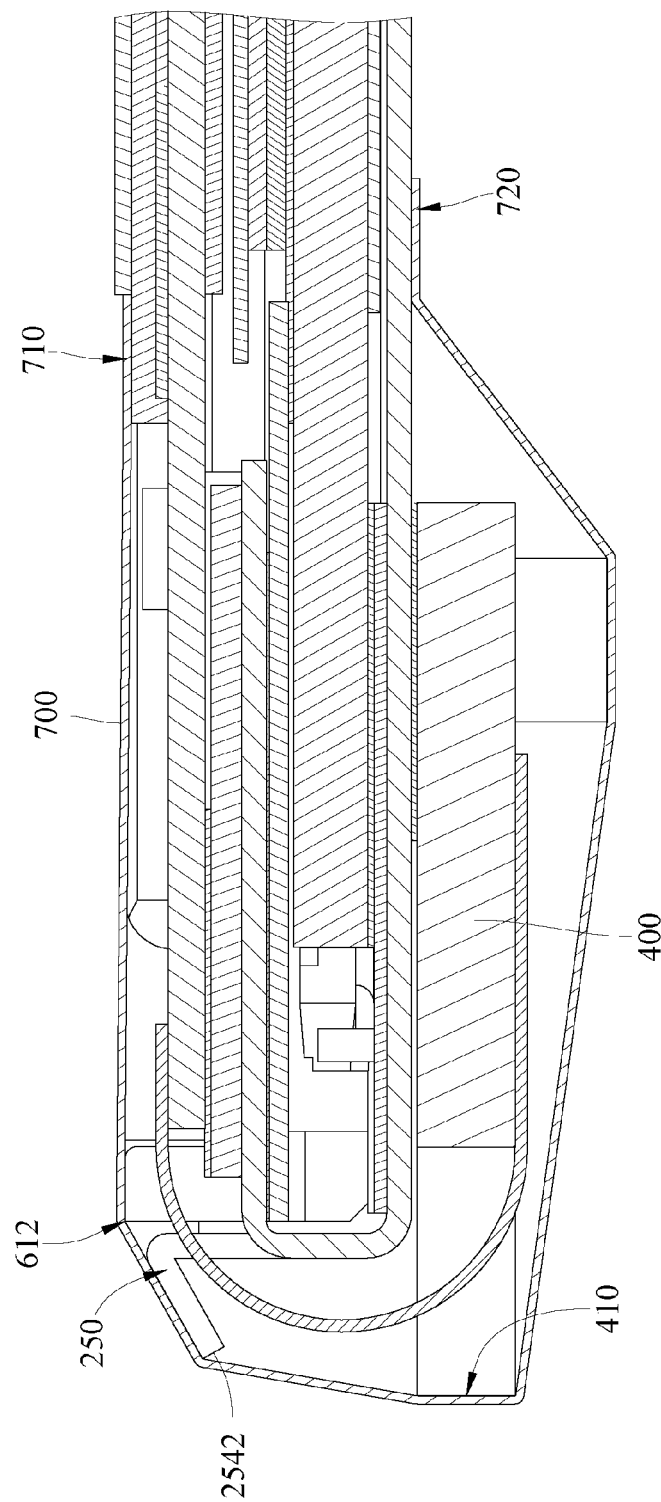
FIG. 17 is a partial side view of the display device in FIG. 16 in which a tape is configured.

In addition, referring to FIG. 16 and FIG. 17, FIG. 16 is a partial side view of a display device according to yet another embodiment of the present invention, FIG. 17 is a partial side view of the display device in FIG. 16 in which a tape is configured. FIG. 17 is similar to FIG. 15, and a main difference is that a bezel 200 may include an extension wall 250. Structures and modifications of the extension wall 250 are similar to the foregoing described, and details are not described herein again. In an embodiment, a second segment 254 of the extension wall 250, for example, tilts downwardly, enabling a tape 700 to extend along the second segment 254 of the extension wall 250 and aiding in assembling. Moreover, it should be noted that in addition to being in contact with an end portion 612 of a side surface 610 of a frame body 600 and an edge 410 of a rigid circuit board 400, the tape 700 is further in contact with an end part 2542 of the second segment 254 of the extension wall 250. Because the extension wall 250 bends toward a direction of the edge 410 of the rigid circuit board 400, when the tape 700 surrounds a flexible circuit board 300, the tape 700 is also more distant from the flexible circuit board 300, reducing a rate that the flexible circuit board 300 is pressed by the tape 700 and a circuit is damaged.

Figure 18:
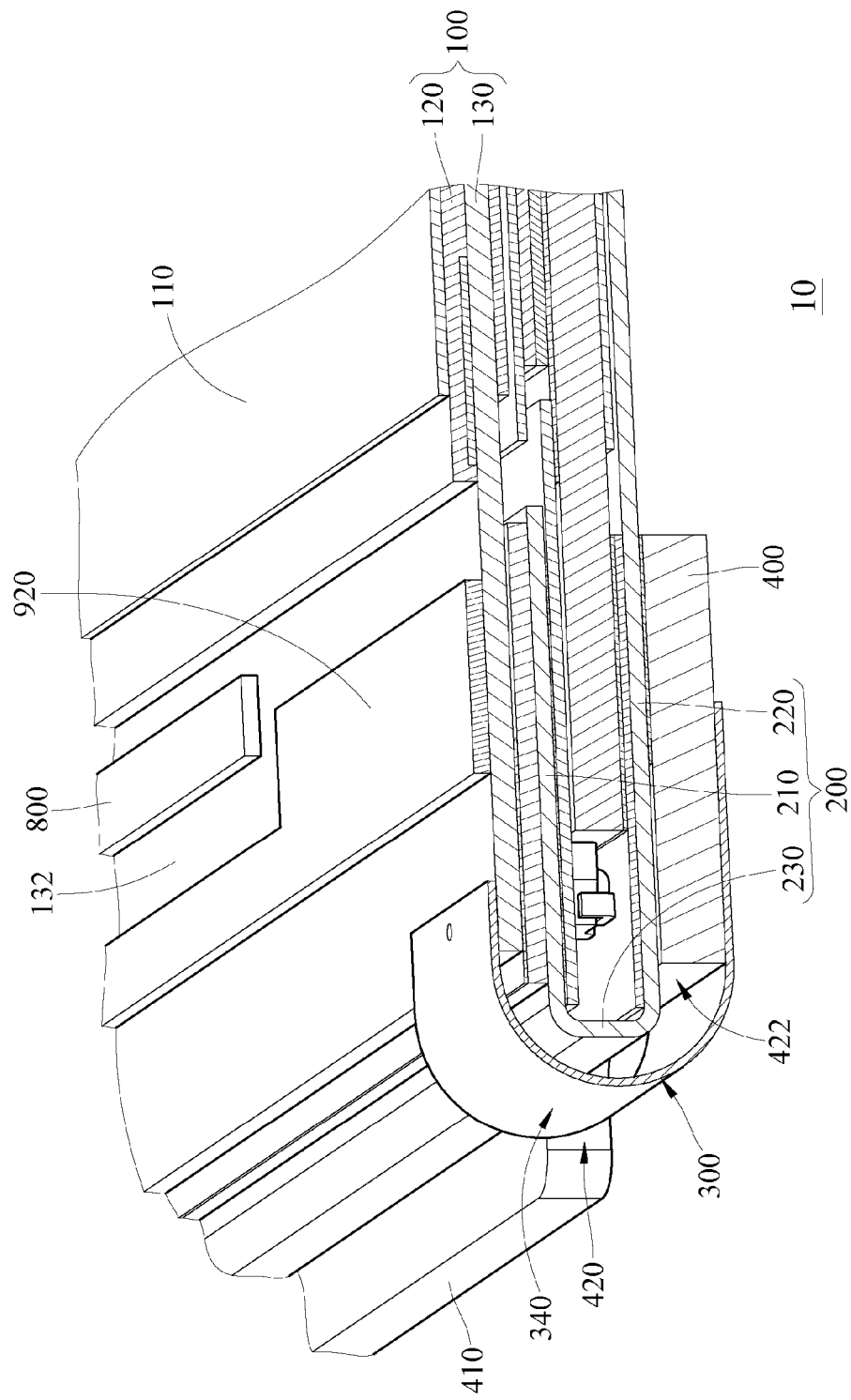
FIG. 18 is a partial oblique view of a display device according to still yet another embodiment of the present invention.

Referring to FIG. 18, FIG. 18 is a partial oblique view of a display device according to still yet another embodiment of the present invention. In an embodiment, a display device 10 may include a pad 920 and a chip 800. A display panel 100, for example, includes a first substrate 120 and a second substrate 130. The second substrate 130 is closer to a top wall 210 of a bezel 200 compared with the first substrate 120. The chip 800 is disposed on a surface 132, back to the top wall 210, of the second substrate 130. The pad 920 is disposed on the surface 132 of the second substrate 130, and at least part of the pad 920 surrounds the chip 800. The pad 920 is configured to protect the chip 800 from being pressed and damaged. In addition, the foregoing tape (not shown in FIG. 18) may be stuck on the pad 920. For example, the pad 920 is first integrated with a tape. When the tape is stuck on the display panel 100, the pad 920 may be simultaneously disposed on the display panel 100, thereby improving pasting efficiency. Alternatively, the pad 920 may be first disposed on the surface 132 of the second substrate 130, and then the tape is stuck on.

In addition, referring to FIG. 7, FIG. 11, FIG. 15, FIG. 17, and FIG. 18, the end 710 of the tape 700 is stuck on the display panel 100, for example, stuck on the first substrate 120, but the present invention is not limited thereto. If there is sufficient space on the second substrate 130, the end 710 may also be stuck on the second substrate 130. This may be adjusted according to a requirement. For example, the end 710 of the tape 700 may be stuck on a top polarizer.

In the display device according to the foregoing embodiments, because the rigid circuit board includes the edge extending outwardly and beyond the side wall of the bezel, and includes the recess configured to accommodate at least part of the connection portion of the flexible circuit board, on the projection plane parallel to the display surface, the margin of the flexible circuit board is between the side wall of the bezel and the edge of the rigid circuit board, and the flexible circuit board is protected by the edge of the rigid circuit board, thereby reducing a rate that the flexible circuit board is pressed by the tape and the circuit is damaged.

The present invention is disclosed through the foregoing preferred embodiments; however, these embodiments are not intended to limit the present invention. Various changes and modifications can be made by any person of ordinary skill in the art without departing from the spirit and scope of the present invention. Therefore, the patent protection scope of the present invention is subject to the appended claims of the present specification.

What is claimed is:
1. A display device, comprising:
a display panel, wherein the display panel comprises a display surface;
a bezel comprising a top wall, a bottom wall, and a side wall between the top wall and the bottom wall, wherein the top wall supports the display panel;
at least one flexible circuit board, comprising a first portion, a second portion, and a connection portion between the first portion and the second portion, wherein the first portion of the flexible circuit board is connected to the display panel;
a rigid circuit board, wherein the rigid circuit board overlaps and faces the bottom wall of the bezel, the rigid circuit board comprises an edge extending outwardly and beyond the side wall, the edge of the rigid circuit board comprises at least one recess, the second portion of the flexible circuit board is connected to the rigid circuit board, and at least part of the connection portion of the flexible circuit board is accommodated in the recess, on a projection plane parallel to the display surface, the flexible circuit board comprises a margin which is a part of the flexible circuit board closest to the edge of the rigid circuit board, and the margin of the flexible circuit board is between the side wall of the bezel and the edge of the rigid circuit board; and
a tape stuck between the display panel and a surface of the bottom wall of the bezel facing the rigid circuit board, wherein the tape surrounds the flexible circuit board and the rigid circuit board, and the tape is in contact with the edge of the rigid circuit board.

2. The display device according to claim 1, wherein the recess comprises an inner side parallel to the edge, and on the projection plane parallel to the display surface, the side wall of the bezel is between the edge of the rigid circuit board and the inner side of the recess of the rigid circuit board.

3. The display device according to claim 1, wherein the display device comprises a frame body, at least part of the frame body surrounds the display panel, and the frame body supports the display panel.

4. The display device according to claim 3, wherein the frame body comprises a side surface which is adjacent to the edge of the rigid circuit board, the side surface of the frame body does not extend beyond the side wall of the bezel, the side surface comprises an end portion in a direction away from the rigid circuit board, and the end portion of the frame body is higher than the first portion of the flexible circuit board.

5. The display device according to claim 4, wherein the tape is in contact with the end portion of the frame body.

6. The display device according to claim 5, wherein the bezel comprises an extension wall, the extension wall comprises a first segment and a second segment that are connected, the first segment of the extension wall extends out from the side wall away from the rigid circuit board, the second segment of the extension wall is connected to the first segment and bends toward the edge of the rigid circuit board, the second segment of the extension wall comprises an end part, and the tape is further in contact with the end part of the second segment of the extension wall.

7. The display device according to claim 3, wherein the frame body comprises an engagement portion, and the engagement portion of the frame body extends into an accommodation space surrounded by the top wall, the bottom wall, and the side wall.

8. The display device according to claim 1, wherein the bezel comprises at least one baffle wall, the at least one baffle wall extends out from the side wall in a direction away from the rigid circuit board, and an end part of the at least one baffle wall is higher than the first portion of the flexible circuit board.

9. The display device according to claim 8, wherein the at least one baffle wall does not overlap with the rigid circuit board on the projection plane parallel to the display surface.

10. The display device according to claim 8, wherein the tape is in contact with the end part of the at least one baffle wall of the bezel.

11. The display device according to claim 10, wherein the bezel comprises an extension wall, the extension wall comprises a first segment and a second segment that are connected, the first segment of the extension wall extends out from the side wall from the rigid circuit board, the second segment of the extension wall is connected to the first segment and bends toward the edge of the rigid circuit board, the second segment of the extension wall comprises an end part, and the tape is in contact with the end part of the second segment of the extension wall.

12. The display device according to claim 1, wherein the bezel comprises an extension wall, the extension wall comprises a first segment and a second segment that are connected, the first segment of the extension wall extends out from the side wall away from the rigid circuit board, and the second segment of the extension wall is connected to the first segment and bends toward the edge of the rigid circuit board.

13. The display device according to claim 12, wherein the second segment of the extension wall comprises an end part, and on the projection plane parallel to the display surface, the end part of the second segment of the extension wall does not extend outwardly and beyond the edge of the rigid circuit board.

14. The display device according to claim 12, wherein the at least one flexible circuit board is two flexible circuit boards, and the extension wall is located between the flexible circuit boards.

15. The display device according to claim 12, wherein the extension wall overlaps with the rigid circuit board on the projection plane parallel to the display surface.

16. The display device according to claim 1, wherein the display device comprises a pad and a chip, the display panel comprises a first substrate and a second substrate, the second substrate is closer to the top wall of the bezel compared with the first substrate, the chip is disposed on a surface, back to the top wall, of the second substrate, the pad is disposed on the surface of the second substrate, and at least part of the pad surrounds the chip.

17. The display device according to claim 16, wherein the display device comprises a tape stuck on the pad.

18. The display device according to claim 16, wherein the display device comprises a tape stuck on the first substrate.

* * * * *